(12) United States Patent
Howell et al.

(10) Patent No.: US 6,806,578 B2
(45) Date of Patent: Oct. 19, 2004

(54) COPPER PAD STRUCTURE

(75) Inventors: Wayne J. Howell, Williston, VT (US); Ronald L. Mendelson, Richmond, VT (US); William T. Motsiff, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/526,394

(22) Filed: Mar. 16, 2000

(65) Prior Publication Data

US 2002/0056910 A1 May 16, 2002

(51) Int. Cl.$^7$ .......................... H01L 23/48; H01L 23/52; H01L 29/40
(52) U.S. Cl. .................. 257/762; 257/737; 257/738; 257/779; 257/780; 257/751; 257/752; 257/774; 779/772; 779/781; 438/629; 438/687; 438/672
(58) Field of Search ................... 257/762, 737–738, 257/751, 752, 774, 773, 779–780, 772, 629, 700; 438/629, 687, 672

(56) References Cited

U.S. PATENT DOCUMENTS

| | | | |
|---|---|---|---|
| 4,840,302 A | * | 6/1989 | Gardner et al. .............. 228/123 |
| 4,843,453 A | * | 6/1989 | Hooper et al. ................. 357/71 |
| 5,048,744 A | * | 9/1991 | Chang et al. ................ 228/123 |
| 5,146,308 A | * | 9/1992 | Chance et al. ................. 357/55 |
| 5,290,732 A | * | 3/1994 | Kumar et al. ................ 437/183 |
| 5,399,898 A | * | 3/1995 | Rostoker ...................... 257/499 |
| 5,656,863 A | * | 8/1997 | Yasunaga et al. ........... 257/778 |
| 5,674,787 A | * | 10/1997 | Zhao et al. .................. 437/230 |
| 5,773,359 A |  | 6/1998 | Mitchell et al. ............ 438/614 |
| 5,900,498 A |  | 5/1999 | Winter et al. .................. 556/51 |
| 5,900,672 A |  | 5/1999 | Chan et al. .................. 257/751 |
| 5,903,058 A |  | 5/1999 | Akram ........................ 257/778 |
| 6,028,362 A | * | 2/2000 | Omura ........................ 257/774 |
| 6,136,707 A | * | 10/2000 | Cohen .......................... 438/687 |
| 6,144,096 A | * | 11/2000 | Lopatin ....................... 257/751 |
| 6,156,651 A | * | 12/2000 | Havemann .................. 438/674 |
| 6,184,143 B1 | * | 2/2001 | Ohashi et al. .............. 438/697 |
| 6,335,570 B2 | * | 1/2002 | Mori et al. .................. 257/751 |

FOREIGN PATENT DOCUMENTS

| | | |
|---|---|---|
| JP | 03-275147 | 10/1991 |
| JP | 09-151749 | 6/1997 |
| JP | 09-320514 | 11/1997 |
| JP | 10-263663 | 9/1998 |
| JP | 10-334175 | 11/1998 |

* cited by examiner

Primary Examiner—Nitin Parekh
(74) Attorney, Agent, or Firm—McGinn & Gibb, PLLC; William D. Sabo, Esq.

(57) ABSTRACT

A structure (and method) for a metallurgical structure includes a passivation layer, a via through the passivation layer extending to a metal line within the metallurgical structure, a barrier layer lining the via, a metal plug in the via above the barrier layer, the metal plug and the metal line comprising a same material, and a solder bump formed on the metal plug.

21 Claims, 2 Drawing Sheets

COPPER PAD STRUCTURE

BACKGROUND OF THE INVENTION

1. Field of the Invention

The present invention generally relates to semiconductor integrated circuits and more particularly to the pads and solder balls used to make electrical connections between the integrated circuit devices having copper wiring and the external electrical environment.

2. Description of the Related Art

Once the manufacturing processes for the last wiring layer of an integrated circuit die is completed, additional processing is required to form connections between the die and its associated printed circuit card or board. This additional processing allows connection to the external electrical environment and is sometimes referred to as "back end of line" or BEOL processing.

One aspect of BEOL processing can involve the formation of lead/tin solder balls, e.g. C4 connections, on the exterior of the integrated circuit die. The solder balls are used to make electrical connection to the last layer of wiring and underlying circuitry contained on the integrated circuit device. In a later assembly process, the free surface of the solder ball is joined to corresponding wiring pads on a printed circuit card, flex circuit cable or ceramic die carrier. FIG. 1 illustrates a cross section of a conventionally fabricated integrated circuit device having aluminum wiring and solder ball connections. More specifically, the exterior of the integrated circuit has a passivation layer 12, typically comprised of silicon dioxide, silicon nitride or silicon oxide/nitride combinations. The passivation layer 12 covers the aluminum last wiring layer 11 and the passivation layer 12 contains an opening (via hole) that exposes the surface of the last wiring layer. The passivation layer is not planar, but rather conformal to the underlying surface that contains the final wiring layer. The via hole is conventionally formed using a standard lithographic and etching process.

Typically, a pad 13 (e.g., liner/barrier) is formed over the via hole. The pad 13 forms a "transition metallurgy" that provides a robust mechanical connection between the solder ball 14 and both the wiring layer 11 and the passivation layer 12. The pad 13 also provides low and stable electrical (contact) resistance between the solder ball 14 and the last wiring layer 11. The pad 13 is typically comprised, for example, of one or more of chromium, tungsten or titanium with overlayers of solderable metals such as copper or gold. Conventionally, the chromium, tungsten, etc. of the pad 13 are placed in contact with the aluminum wiring layer 11 and the solderable metal(s) of the pad 13 is placed in contact with the solder 14. During solder ball 14 formation on the integrated circuit and subsequent attachment of the solder balls 14 to a printed circuit card, the lead or tin in the solder 14 may completely react with the solderable metal and bring lead or tin into contact with the chromium, tungsten, etc. layer.

In the case of aluminum last wiring layers, there is limited inter-metallic formation between the aluminum 11 and lead and tin in the solder ball 14. Any tin that diffuses through micro cracks or grain boundaries of the pad 13 does not result in rapid, strong inter-metallic formation with aluminum. Also, with aluminum wiring, there is insufficient reaction to consume the pad 13, i.e. react it into inter-metallic, or propagate inter-metallic into the aluminum wiring line.

However, high performance integrated circuits have introduced copper as the last wiring layer. Copper has lower electrical resistance than aluminum and, as a result, yields faster propagation of a signal through a wiring line, increasing the operational speed of the integrated circuit. Copper however, readily reacts with (forms inter-metallics with) the tin 14. The copper-tin inter-metallics have an associated volume change, that can be both mechanically weak and have increased electrical resistance. A mechanically weak inter-metallic can degrade the reliability, e.g. ability to withstand thermal cycles, of the integrated circuit device. The increased electrical resistance of the inter-metallic can also slow the signal propagation both between the device and its external connection and more particularly through internal device wiring.

When sufficient excess of tin exists in the solder ball 14, as in the case of a solder ball made from eutectic solder (63% tin, 37% lead), inter-metallic formation can be extensive, extending well into the wiring lines degrading signal propagation and potentially damaging dielectric films adjacent to the wires, because of the volume change associated with inter-metallic formation. There is, therefore, a need for an easy to manufacture pad structure which provides mechanically and electrically robust interconnections between copper wiring and solder balls without introducing the possibility of tin or lead diffusion into the last copper wiring lines. The invention described below provides such a pad structure, in a planar configuration.

SUMMARY OF THE INVENTION

It is, therefore, an object of the present invention to provide a structure and method for forming mechanically and electrically robust interconnections between integrated circuit copper wiring and solder balls, without possibility of tin or lead diffusion from the solder balls into the last copper wiring lines.

One embodiment of the invention comprises a metallurgical structure that includes a passivation layer, a via through the passivation layer extending to a metal line within the metallurgical structure, a barrier layer lining the via, a metal plug in the via above the barrier layer, the metal plug and the metal line comprising a same material, and a solder bump formed on the metal plug.

The "same material" can be copper and the barrier layer can be one or more layers of Ti, TiN, Ta, and TaN. The barrier layer and the metal plug prevent elements within the solder bump from diffusing to the metal line. The metal plug, the barrier layer and the passivation layer form a planar exterior surface of the metallurgical structure. The solder ball can be in direct contact with the metal plug or the structure can include a second barrier layer above the metal plug and a second metal plug above the second barrier layer, where the second metal plug is in direct contact with the solder ball.

Another embodiment of the invention comprises a method of forming an integrated circuit structure that includes forming a via through an exterior of the integrated circuit structure to internal components of the integrated circuit structure, lining the via with a barrier layer, forming a plug above the barrier layer, the plug and the internal components comprising a same material, and forming a connector on the plug.

The "same material" can again comprises copper, and the barrier layer can comprise one or more layers of Ti, TiN, Ta, and TaN. Again, the barrier layer prevents elements within the connector from diffusing to the internal components.

The method also includes a process of polishing the integrated circuit structure such that the plug, the barrier layer and the exterior form a planar surface. The connector can be formed to be in direct contact with the plug or the inventive process can include forming a second barrier layer above the plug and forming a second plug above the second barrier layer, such that the second plug is in direct contact with the connector.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
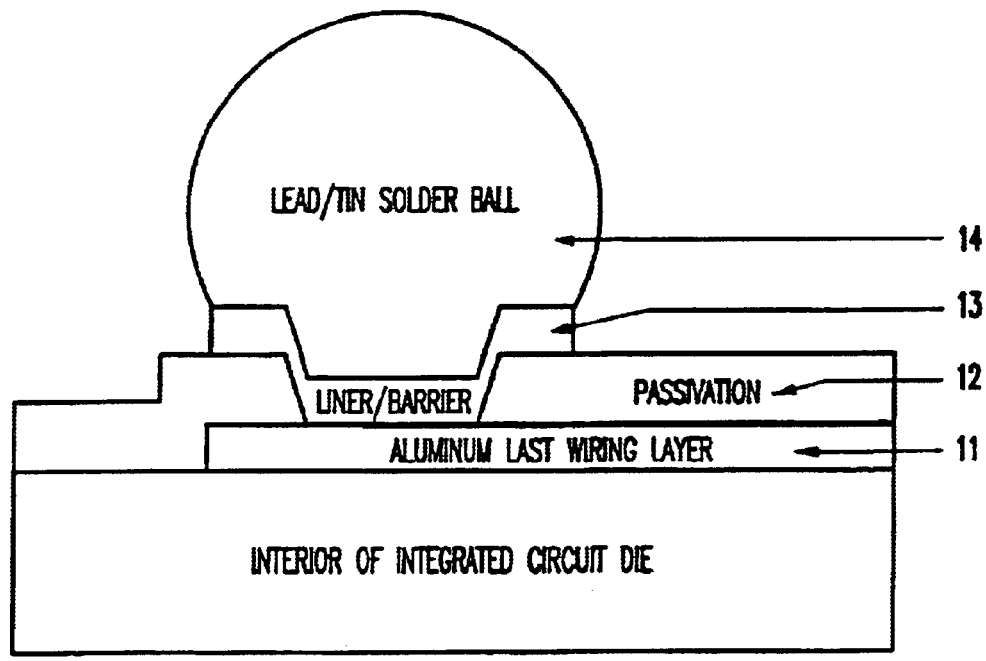
FIG. 1 is a schematic diagram of a conventional via, pad, and solder ball.

As discussed above, conventional BEOL structures, such as that shown in FIG. 1, suffer from the disadvantage that, when copper is used as the last metalization layer, tin diffusion can result in a structure that is not mechanically and electrically robust. The invention overcomes these problems by using a novel copper plug and barrier layer, as discussed below.

Figure 2:
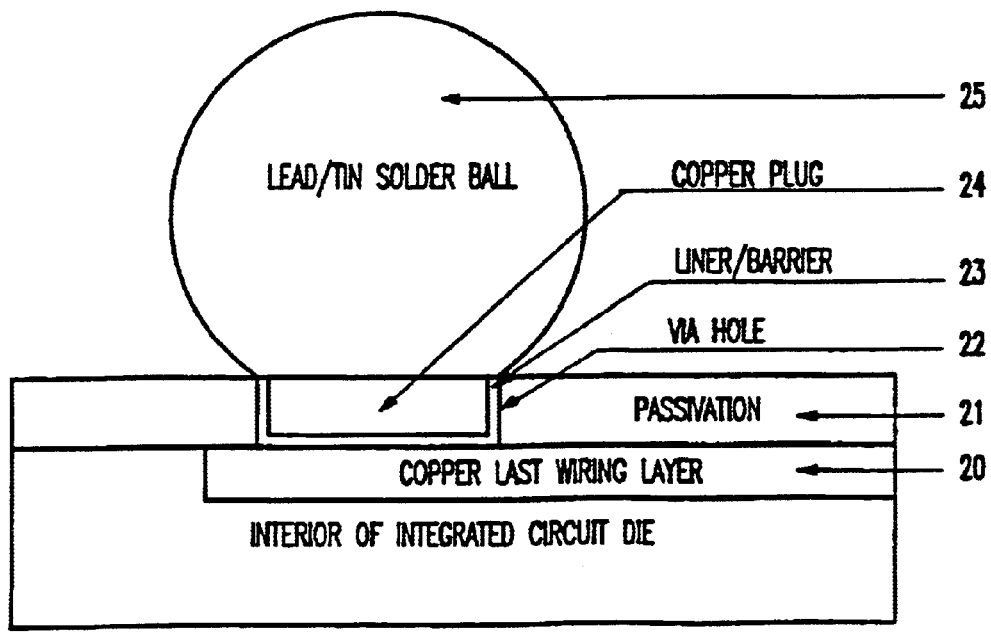
FIG. 2 is a schematic diagram of the inventive via, plug and solder ball.

A first embodiment of the invention is shown in FIG. 2. The invention replaces the conventional pad structure 13 as described above with the one shown in FIG. 2. The last copper wiring layer 20 on the integrated circuit device is typically formed using a damascene process and is covered with an appropriate passivation films stack 21. The passivation films stack is typically comprised of one or more layers of silicon dioxide, silicon nitride or combinations thereof, deposited by chemical vapor deposition (CVD), plasma enhanced chemical vapor deposition (PECVD), etc. methods. An opening (via hole) 22 is formed in the passivation films stack using conventional lithographic and etching techniques employing photoresist and reactive ion etching.

After removal of the photoresist, the stack of films 21 is sequentially blanket deposited with a liner 23 and then a copper plug 24. Initially, the "liner/barrier" film(s) 23 comprised of Ti, TiN, Ta, TaN, or combinations thereof is deposited by sputtering or reactive sputtering techniques. The total thickness of the liner films stack 23 is between 100 and 1000 Å thick. The liner films 23 are not limited to those specified above, but as would be known by one ordinarily skilled in the art could be any substance that is selected to have the properties of good adhesion to both copper wiring and the overlayer passivation films, relatively low electrical resistance and excellent resistance to diffusion by lead, tin and copper.

Next, the copper plug 24 is deposited over the liner by sputtering, electroplating or evaporation techniques with sufficient thickness to be at least coplanar with the top of the passivation films 21. Chemical mechanical polishing (CMP) is then used to remove the copper 24 and the liner 23 from the field areas leaving a plug of liner 23 and copper 24 in the via hole. If the passivation films stack 21 was not initially planar, the CMP process can be continued (with the same or a different slurry) after the liner is removed to planarize both the passivation 21 and filled vias 22.

A lead/tin solder ball 25 is then formed on the via plug 24 using evaporation through a mask, solder ink jet or other well known techniques. The amount of inter-metallic formation is controlled by the amount of tin in the solder ball and the thickness of the copper 24 in the filled via 22 which in turn is controlled by the thickness of the passivation films 21 and the liner 23.

Figure 3:
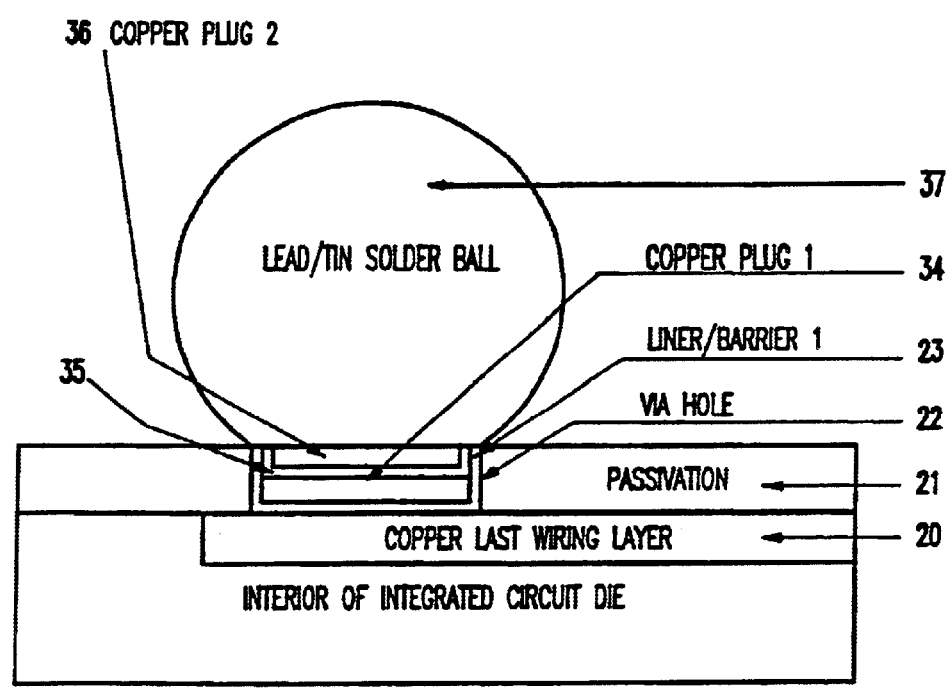
FIG. 3 is a schematic diagram of another embodiment of the inventive via, plug and solder ball.

A second embodiment of the invention, shown in FIG. 3, provides a redundant "liner/barrier" layer 35 in the filled via 22 to achieve minimum inter-metallic formation and maximum protection of the integrated circuit copper wiring 20 from diffusion of elements contained in the solder ball. In this embodiment, the via 22 is filled as described in the first embodiment. The copper 24 in the filled via 22 is then selectively recessed using an aqueous solution of ammonium persulfate or other solution that will preferentially etch copper rather than the liner. Typically, the copper 24 is recessed between 1000 and 10000 Å to form a recessed copper plug 34 (e.g., copper plug 1). A second liner/barrier 35 comprised of Ti, TiN, Ta, TaN, or combinations thereof are blanket deposited over the recessed copper plug 34 by sputtering or reactive sputtering techniques. A second copper film 36 (e.g., copper plug 2) is deposited over the blanket liner/barrier film(s) by sputtering, electroplating or evaporation techniques with sufficient thickness to be at least coplanar with the top of the passivation films.

Again the liner/barrier 35 thickness is controlled to be less than the amount which would be coplanar with the top of the passivation films stack, insuring that a thin copper film 36 remains in the center of the via when the subsequent chemical, mechanical polish is complete. A lead/tin solder ball 37 is formed on the second via plug 36 using evaporation through a mask, solder ink jet or other well-known techniques.

Therefore, the invention replaces the conventional liner 13 with a copper plug 24, 34, 36 and barrier 23, 35. This structure produces a number of a advantages when compared to the conventional structure. For example, the copper plug/liner of the invention prevents tin diffusion to the underlying copper wiring layer 20. The copper plug consumes any tin which would otherwise diffuse to the underlying copper wiring. The invention is not limited to copper wiring. Instead, the invention is applicable to any material with similar characteristics so long as the plug and the underlying wiring are of the same material. This allows the plug to consume the potential impurities before they reach the underlying wiring layer. The barrier layer acts to stop any tin impurities which are not consumed by the copper. Further, the invention is different than structures which utilize a thin copper layer in that the copper plug provides sufficient thickness to consume large amounts of tin impurities and to form a strong inter-metallic bond with the lead/tin solder ball.

Additionally, the invention produces a structure which is co-planer with the passivation layer 21, which makes the formation of the lead/tin solder ball 25, 37 simpler and less prone to manufacturing defect. Also, the physical strength of the copper plug/liner structure is superior to the conventional liner 13 (because copper makes a very strong bond with tin/lead solder balls) and, therefore, provides superior mechanical bonding strength between the integrated circuit and the solder ball 25, 37.

While the invention has been described in terms of preferred embodiments, those skilled in the art will recognize that the invention can be practiced with modification within the spirit and scope of the appended claims.

What is claimed is:

1. A metallurgical structure comprising:
   a passivation layer;
   a via through said passivation layer extending to a metal line within said metallurgical structure;
   a first barrier layer lining said via;
   a first metal plug in said via above said first barrier layer;
   a second barrier layer adjacent said first metal plug;
   a second metal plug adjacent said second barrier layer, wherein said second metal plug, said first barrier layer, and said second barrier layer form a planar exterior surface of said integrated circuit structure;
   a solder bump formed on said planar exterior surface, wherein said sold bump is in direct contact with said second metal plug, said first barrier layer, and said second barrier layer; and
   wherein said second metal plug is operable for preventing tin diffusion from said solder bump to said metal line.

2. The metallurgical structure of claim 1, wherein said first metal plug, said second metal plug, and said metal line comprise a same material, wherein said same material comprises copper.

3. The metallurgical structure of claim 1, wherein said first barrier layer and said second barrier layer comprise one or more layers of Ti, TIN, Ta, and TaN.

4. The integrated circuit structure of claim 1, wherein said solder bump is comprised of a lead/tin alloy.

5. The integrated circuit structure of claim 1, wherein said second plug forms an intermetallic formation with elements diffusing from said solder bump so as to prevent said elements from penetrating through said first barrier layer and said second barrier layer into said metal line.

6. The integrated circuit structure of claim 1, wherein each of said second metal plug, said first barrier layer, and said second barrier layer is operable for preventing impurities to reach said metal line.

7. An integrated circuit structure comprising:
   internal components within an exterior covering;
   a via extending through said exterior covering to said internal components;
   a first barrier layer lining said via;
   a first plug in said via above said first barrier layer;
   a second barrier layer above said first plug;
   a second plug above said second barrier layer, wherein said second plug, aid first barrier layer, and said second barrier layer form a planar exterior surface of said integrated circuit structure; and
   a connector formed on said planar exterior surface, wherein said connect is in direct contact with said second plug, said first barrier layer, and said second barrier layer,
   wherein said first plug, and said second plug, and said internal components comprise a same material, and
   wherein said second plug forms an intermetallic formation with elements diffusing from said solder bump so as to prevent said elements from penetrating through said first barrier layer and said second barrier layer into said internal components.

8. The integrated circuit structure of claim 7, wherein said same material comprises copper.

9. The integrated circuit structure of claim 7, wherein said first barrier layer and said second barrier layer comprise one or more layers of Ti, TIN, Ta, and TaN.

10. The integrated circuit structure of claim 7, wherein said connector is comprised of a lead/tin alloy.

11. The integrated circuit structure of claim 7, wherein said second plug is operable for preventing tin diffusion from said connector to said internal components.

12. The integrated circuit structure of claim 7, wherein each of said second plug, said first barrier layer, and said second barrier layer is operable for preventing impurities to reach said internal components.

13. A metallurgical structure, comprising:
   a first layer of copper formed on a structure;
   a first barrier layer formed on said first layer of copper;
   a second layer of copper formed on said first barrier layer;
   a second barrier layer formed on said second layer of copper;
   a third layer of copper formed on said second barrier layer; and
   a conductive structure formed on said third layer of copper, wherein said conductive structure comprises impurities, wherein at least some of said impurities diffusing from said conductive structure,
   wherein said second layer of copper forms an intermetallic formation with said impurities diffusing from said conductive structure, and adheres to said conductive structure, so as to prevent said impurities from penetrating through said first barrier layer into said first layer of copper, and
   wherein said conductive structure is in direct contact with said third layer of copper, said first barrier layer, and said second barrier layer.

14. The metallurgical structure of claim 13, wherein said conductive structure comprises a solder ball.

15. The metallurgical structure of claim 14, wherein said solder ball comprises a lead/tin alloy.

16. The metallurgical structure of claim 13, wherein said first barrier or said second barrier layer arc selected from the group consisting of Ti, TiN, Ta, TaN, and combinations thereof.

17. The metallurgical structure of claim 13, wherein said third layer of copper has an upper surface that is substantially coplanar with surrounding insulative structures.

18. The metallurgical structure of claim 13, wherein said metallurgical structure is planerized.

19. The metallurgical structure of claim 13, wherein said third layer of copper is operable for preventing tin diffusion from said conductive structure to said first layer of copper.

20. The metallurgical structure of claim 13, wherein each of said third layer of copper, said first barrier layer, and said second barrier layer is operable for preventing impurities to reach said first layer of copper.

21. The metallurgical structure of claim 13, wherein said impurities comprise tin.

* * * * *